US012813343B2

(12) United States Patent
Xiong et al.

(10) Patent No.: US 12,813,343 B2
(45) Date of Patent: Nov. 24, 2026

(54) LIGHT-EMITTING DEVICE

(71) Applicant: QUANZHOU SANAN SEMICONDUCTOR TECHNOLOGY CO., LTD., Nanan City (CN)

(72) Inventors: Weiping Xiong, Tianjin (CN); Zhiwei Wu, Tianjin (CN); Di Gao, Tianjin (CN); Huan-Shao Kuo, Tianjin (CN); Yu-Ren Peng, Tianjin (CN)

(73) Assignee: QUANZHOU SANAN SEMICONDUCTOR TECHNOLOGY CO., LTD., Nanan City (CN)

( * ) Notice: Subject to any disclaimer, the term of this patent is extended or adjusted under 35 U.S.C. 154(b) by 377 days.

(21) Appl. No.: 18/405,316

(22) Filed: Jan. 5, 2024

(65) Prior Publication Data

US 2024/0145441 A1 May 2, 2024

Related U.S. Application Data

(63) Continuation-in-part of application No. PCT/CN2021/104777, filed on Jul. 6, 2021.

(51) Int. Cl.

*H10W 90/00* (2026.01)
*H10H 20/821* (2025.01)
*H10H 20/857* (2025.01)

(52) U.S. Cl.

CPC .......... *H10W 90/00* (2026.01); *H10H 20/821* (2025.01); *H10H 20/857* (2025.01)

(58) Field of Classification Search

CPC .... H10H 20/821; H10H 20/857; H10W 90/00
USPC ........ 257/79
See application file for complete search history.

(56) References Cited

U.S. PATENT DOCUMENTS 10,930,814 B1 * 2/2021 Li .................. H10H 20/813
2020/0251616 A1 * 8/2020 Liu .................. H10H 29/14

FOREIGN PATENT DOCUMENTS

CN 204289445 U 4/2015
CN 204289528 U * 4/2015
CN 209626249 U * 11/2019

OTHER PUBLICATIONS

Search Report issued to PCT application No. PCT/CN2021/104777 on Apr. 8, 2022, with English translation, 4 pages.

* cited by examiner

*Primary Examiner* — Igwe U Anya
(74) *Attorney, Agent, or Firm* — MUNCY, GEISSLER, OLDS & LOWE, P.C.

(57) ABSTRACT

The light-emitting device includes a substrate, a light-emitting chip unit formed on the substrate and including multiple chips, an isolation groove extending in a first direction and separating two adjacent ones of the chips, and a bridging structure. The isolation groove is defined by a bottom and two sidewalls and has a first groove section and a second groove section arranged in the first direction. The first groove section has a width in a width direction perpendicular to the first direction that is greater than a width of the second groove section in the width direction. At the first groove section, one of the sidewalls has a curved portion. The bridging structure is formed on the bottom and the sidewalls, covers the curved portion, and electrically connects the two adjacent ones of the chips.

18 Claims, 5 Drawing Sheets

LIGHT-EMITTING DEVICE

CROSS-REFERENCE TO RELATED APPLICATION

This application is a continuation-in-part (CIP) of International Application No. PCT/CN2021/104777, filed on Jul. 6, 2021, and incorporated by reference herein in its entirety.

FIELD

The disclosure relates to a light-emitting device.

BACKGROUND

In a high voltage light-emitting diode (LED), two adjacent light-emitting chips are separated by an isolation groove and electrically connected by an interconnecting structure. In the current state of technology, the interconnecting structure is generally formed by vapor deposition where vapor is deposited laterally onto two sidewalls that define the isolation groove. Once the sidewalls are inclined too steeply, further vapor deposition becomes difficult which may result in the interconnecting structure being formed with insufficient thickness that may be more susceptible to cracking. As a result, there may be high resistance between adjacent chips in the high voltage LED. In this case, a higher drive current is needed to power the high voltage LED which may cause the high voltage LED to burn out easily, or the interconnecting structure of the high voltage LED to fail, thereby rendering the high voltage LED unable to emit light normally.

In a conventional high voltage light-emitting diode (LED) 1 including multiple chips, an interconnecting structure 14 electrically connects two adjacent ones of the chips. FIG. 1A illustrates the conventional high voltage light-emitting diode 1. The conventional high voltage light-emitting diode 1 includes a substrate 10, a first chip 11, and a second chip 12 that are formed on the substrate 10, and an isolation groove 13 that separates the first chip 11 and the second chip 12, and that is defined by a bottom and two sidewalls. The two chips (the first chip 11 and the second chip 12) each includes a first mesa portion (I) and a second mesa portion (II). The isolation groove 13 is located between the two chips 11, 12. The two sidewalls are respectively adjacent to the first mesa portion (I) of one of the two chips 11, 12 and the second mesa portion (II) of the other one of the two chips 11, 12. The conventional high voltage light-emitting diode 1 further includes an interconnecting structure 14 that is formed across the first mesa portion (I) of one of the two chips 11, 12, and the second mesa portion (II) of the other one of the two chips 11, 12. The interconnecting structure 14 partially covers a surface of either the first mesa portion (I) or the second mesa portion (II) of each of the two chips 11,12, and the sidewalls, to establish an electrical connection between the first chip 11 and the second chip 12. However, as shown in FIG. 1B, two angles ($\alpha_1$, $\alpha_2$) between the two sidewalls and the substrate 10 may be relatively large angles, such as 86.9° and 73.8°. When forming the interconnecting structure 14 via vapor deposition, vapor is deposited laterally on the sidewalls, and the above-mentioned large angles may increase the difficulty of lateral vapor deposition, resulting in insufficient deposition thickness of the interconnecting structure 14 on the sidewalls (see FIG. 1B). Specifically, the interconnecting structure 14 has a first deposition thickness at portions of and a second deposition thickness that is greater than the first deposition thickness at top surfaces of the first mesa portion (I) and the second mesa portion (II). In general, a ratio of the first deposition thickness to the second deposition thickness of the interconnecting structure 14 ranges from 2:10 to 4:10. Accordingly, the first deposition thickness of the interconnecting structure 14 in the conventional high voltage light-emitting diode 1 is insufficient, and causes the interconnecting structure 14 to easily crack and have a high resistance. As a result, the conventional high voltage light-emitting diode 1 will need to be operated under a high drive current and may easily burn out. The insufficient deposition thickness may even cause the interconnecting structure 14 to break under a high drive current, thereby rendering the conventional high voltage light-emitting diode 1 unable to emit light. To address the aforementioned problems, a common approach is to increase the thickness of the interconnecting structure 14. However, increasing the thickness of the interconnecting structure 14 may, on the one hand, lead to the conventional high voltage light-emitting diode 1 having an uneven surface, posing challenges for subsequent processing, and on the other hand, increase manufacturing costs.

SUMMARY

Therefore, an object of the disclosure is to provide a light-emitting device that can alleviate at least one of the drawbacks of the prior art.

According to the disclosure, the light-emitting device includes a substrate, a light-emitting chip unit formed on the substrate and including multiple chips, an isolation groove extending in a first direction and separating two adjacent ones of the chips, and a bridging structure. The isolation groove is defined by a bottom and two sidewalls and has a first groove section and a second groove section arranged in the first direction. The first groove section has a width in a width direction perpendicular to the first direction that is greater than a width of the second groove section in the width direction. At the first groove section, one of the sidewalls has a first wall portion that is immediately adjacent to the second groove section and that extends in a second direction which intersects the first direction, a second wall portion that extends in the first direction, and a curved portion that connects the first wall portion and the second wall portion. The bridging structure is formed on the bottom and the sidewalls, covers the curved portion, and electrically connects the two adjacent ones of the chips.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1A:
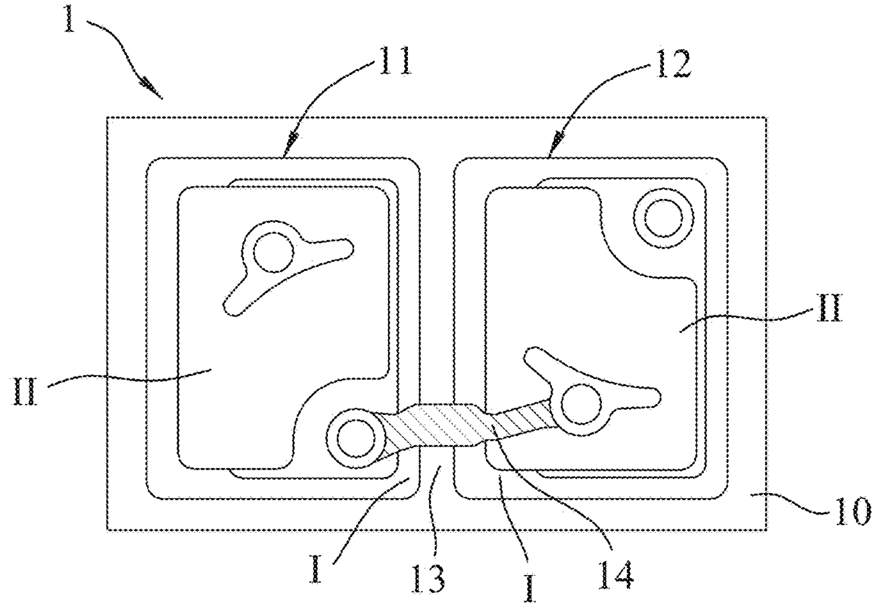
FIG. 1A PRIOR ART
FIG. 1A shows a schematic top view of a conventional high voltage light-emitting diode.
Figure 1B:
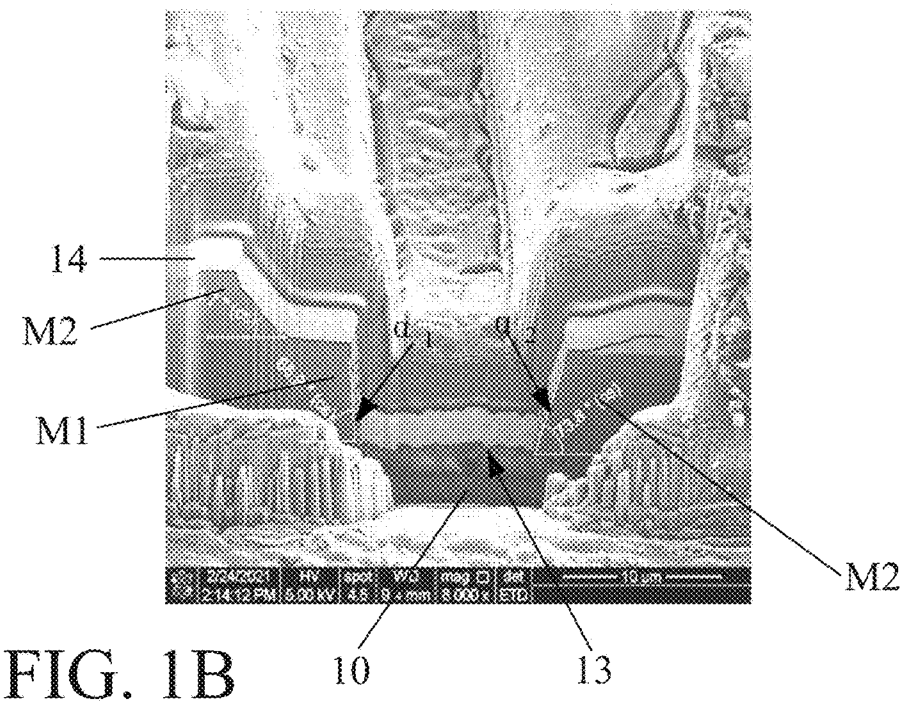
FIG. 1B PRIOR ART
FIG. 1B shows a scanning electron microscope (SEM) image of a cross-section of an isolation groove of the conventional high voltage light-emitting diode in FIG. 1A.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

First Embodiment

Figure 2:
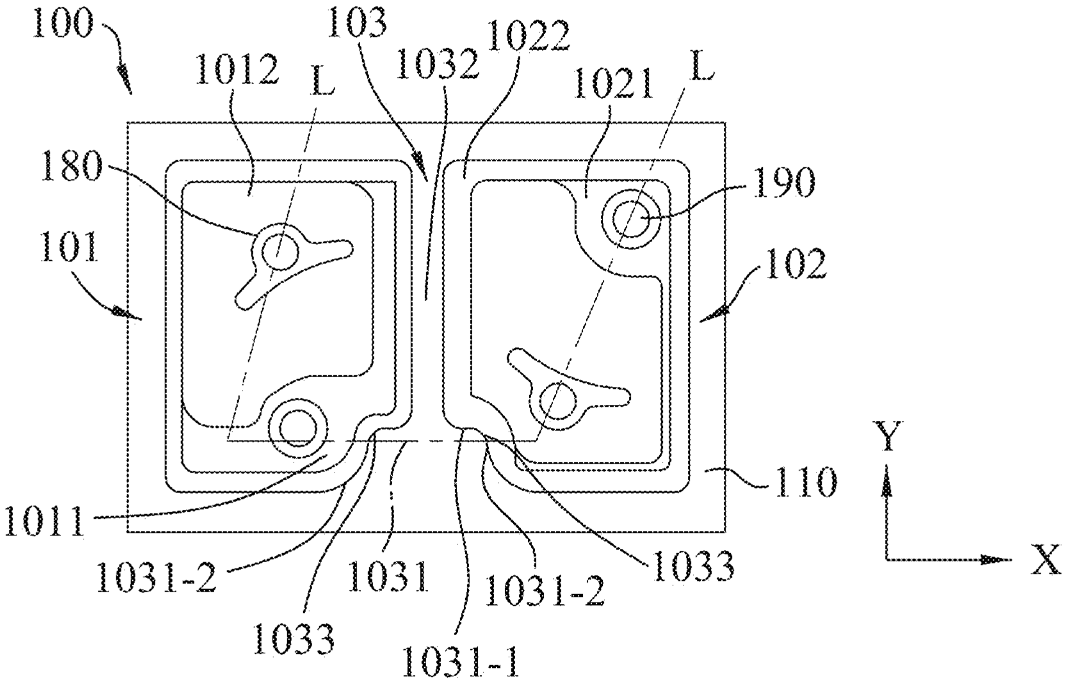
FIG. 2 is a schematic top view of a first embodiment of a light-emitting device according to the present disclosure.

The present disclosure provides a light-emitting device that may be a high voltage light-emitting device or a red light-emitting device and may include a substrate 110 and a plurality of light-emitting chip units 100 formed on the substrate 110. Each light-emitting chip unit 110 includes multiple chips. FIG. 2 illustrates a first embodiment of the light-emitting device according to the disclosure, in which, for the sake of clarity, only one light-emitting chip unit 100 and two chips (i.e., a first chip 101 and a second chip 102) in the light-emitting chip unit 100 are shown. However, it should be understood that the light-emitting device may include a plurality of light-emitting chip units 100 formed on the substrate 110, and that each light-emitting chip unit 100 may include multiple chips.

Figure 3A:
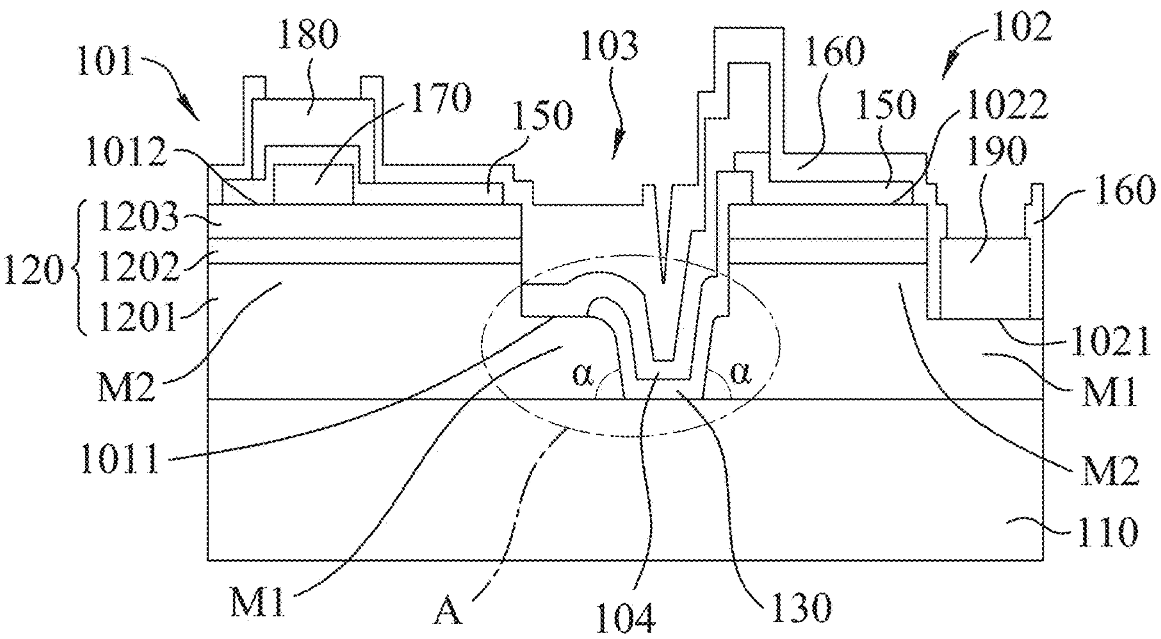
FIG. 3A is a schematic cross-sectional view of the light-emitting device of FIG. 2 taken along a line L-L.

As shown in FIG. 3A, each of the chips 101, 102 of the light-emitting chip unit 100 includes a semiconductor laminate 120 formed on the substrate 110. In one embodiment, the semiconductor laminate 120 is a multi-layer structure including, for example, a first semiconductor layer 1201, an active layer 1202, and a second semiconductor layer 1203 that are disposed on the substrate 110 in a thickness direction in such order.

In this embodiment, the semiconductor laminate 120 is formed by metal organic chemical vapor deposition (MOCVD) or other epitaxial growth methods, and includes a semiconductor material that may allow the light-emitting device to emit ultraviolet, blue, green, yellow, red, or infrared light. In certain embodiments, the semiconductor laminate 120 may include a nitride-based material capable of emitting light with a wavelength ranging from 200 nm to 950 nm. Specifically, the semiconductor laminate 120 may be a gallium nitride-based semiconductor laminate 120, which is commonly doped with a dopant, such as aluminum and indium, and emits light with a wavelength ranging from 200 nm to 550 nm. In certain embodiments, the semiconductor laminate 120 is an AlGaInP or AlGaAs-based semiconductor laminate 120 which emits light with a wavelength ranging from 550 nm to 950 nm. In certain embodiments, the first semiconductor layer 1201 and the second semiconductor layer 1203 may be respectively doped with an n-type dopant and a p-type dopant so as to provide electrons or holes, respectively. For example, the n-type dopant may be Si, Ge, or Sn, and the p-type dopant may be Mg, Zn, Ca, Sr, or Ba. In certain embodiments, the first semiconductor layer 1201, the active layer 1202, and the second semiconductor layer 1203 may be made of AlGaInN, GaN, AlGaN, AlInP, AlGaInP, GaAs or AlGaAs. The first semiconductor layer 1201 and the second semiconductor layer 1203 may include a cladding sub-layer that provides electrons or holes, and may also include other sub-layers such as a current spreading sub-layer, a window sub-layer, and an ohmic contact sub-layer, which constitute a multi-layered structure. The sub-layers may have different doping concentrations or may be made of different components. The active layer 1202 is a region where electrons and holes recombine to emit light, and may include different materials which allow the active layer 1020 to emit light at different wavelengths. The active layer 1202 may be a single quantum well structure or a multiple quantum well (MQW) structure. The MQW structure includes quantum well layers and quantum barrier layers that are alternately arranged. The active layer 1202 may be designed to emit light with different wavelengths by adjusting its composition ratio. The active layer 1202 may have a thickness ranging from 6 μm to 8 μm in the thickness direction.

In this embodiment, the semiconductor laminate 120 includes an AlGaInP-based material and has a thickness ranging from 6 μm to 8 μm in the thickness direction.

In one embodiment, the semiconductor laminate 120 may include a GaN-based material and have a thickness ranging from 4 μm to 6 μm in the thickness direction. In another embodiment, the semiconductor laminate 120 may include a GaAs-based material and have a thickness ranging from 6 μm to 8 μm.

Figure 3B:
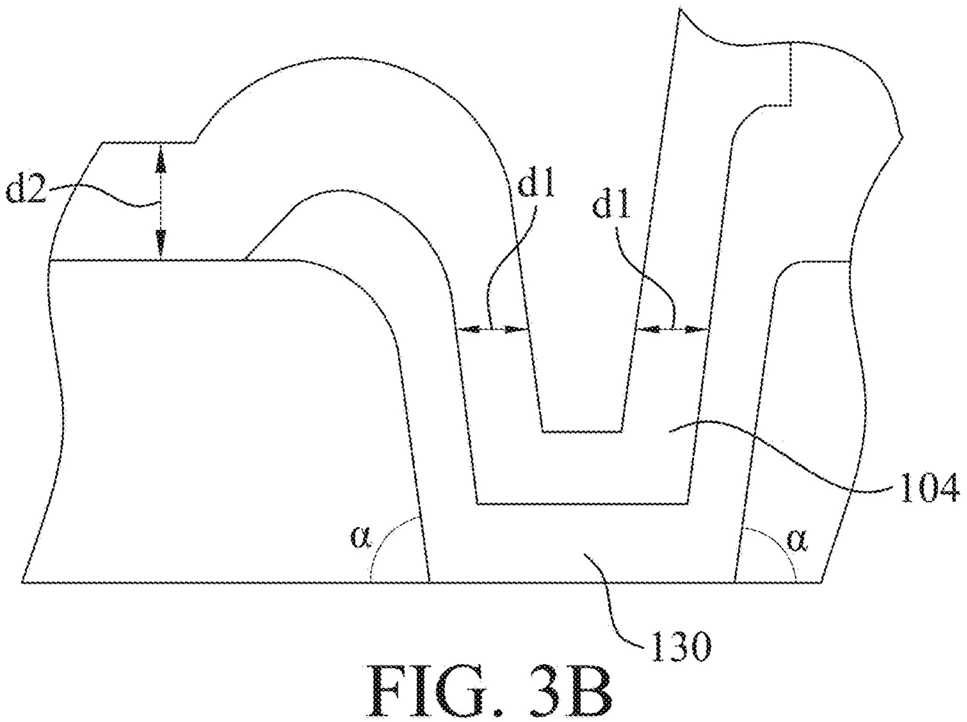
FIG. 3B shows a fragmentary enlarged schematic cross-sectional view of a portion A in FIG. 3A.
Figure 4:
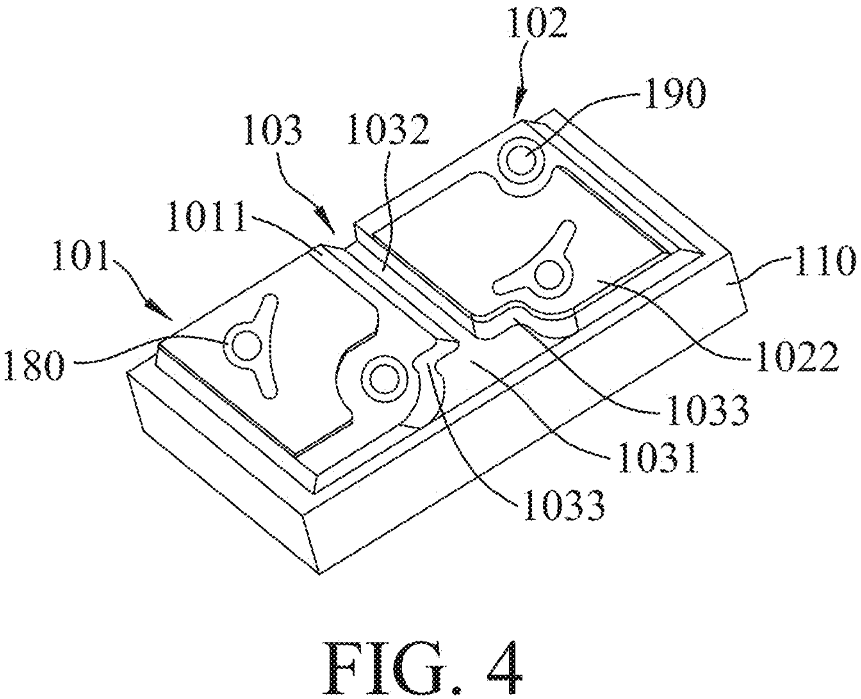
FIG. 4 shows a schematic perspective view of the light-emitting device of FIG. 2.

Referring to FIGS. 2 to 4, the light-emitting device further includes an isolation groove 103 located between two adjacent ones of the multiple chips 101, 102 of the light-emitting chip unit 100, namely, the first chip 101 and the second chip 102. The isolation groove 103 extends in a first direction (Y) and penetrates in the thickness direction from between the second semiconductor layers 1203 of the two adjacent chips downwards to between the first semiconductor layers 1201, or even downwards into the substrate 110, so as to separate the two adjacent chips. The light-emitting device may include an insulating dielectric layer 130 disposed within the isolation groove 103 and a bridging structure 104 formed on the insulating dielectric layer 130, as shown in FIG. 3A. As shown in FIGS. 2 and 3A, the semiconductor laminate 120 of each of the chips 101, 102 has a first mesa surface 1011, 1021 that is constituted by the first semiconductor layer 1201, and a second mesa surface 1012, 1022 that is constituted by the second semiconductor layer 1203. Each of the first and second chips 101, 102 has a first mesa portion (M1) that is constituted by the first semiconductor layer 1201 and that has the first mesa surface 1011, 1021, and a second mesa portion (M2) that is constituted by the first semiconductor layer 1201, the active layer 1202, and the second semiconductor layer 1203, and that has the second mesa surface 1012, 1022. The first mesa surface 1011, 1021 of one of the two adjacent ones of the chips 101, 102 is adjacent to the second mesa surface 1012, 1022 of the other of the two adjacent ones of the chips 101, 102. The first mesa portion (M1) may be formed by etching the semiconductor laminate 120 to remove the second semiconductor layer 1203, the active layer 1202, and a part of the first semiconductor layer 1201. The isolation groove 103 is located between the first mesa portion (M1) of the first chip 101 and the second mesa portion (M2) of the second chip 102 and is defined by a sidewall that is adjacent to the first mesa portion (M1) of the first chip 101 and a sidewall that is adjacent to the second mesa portion (M2) of the second chip 102. In one embodiment, the semiconductor laminate 120 of each of the chips 101, 102 has a connecting surface that interconnects the second mesa surface 1012, 1022 and the first mesa surface 1011, 1021. The connecting surface is inclined with respect to an imaginary surface that extends from the first mesa surface 1011, 1021 by an angle ranging from, e.g., 50 degree to 70 degree. In addition, in this embodiment, as shown in FIG. 3A, there is an angle ($\alpha$) between the sidewall that is adjacent to the first mesa surface 1011, 1021 or the second mesa surface 1012, 1022 and a surface of the substrate 110. That is, the angle ($\alpha$) is between the sidewall that is adjacent to the first mesa surface 1011, 1021 of the first chip 101 or the second mesa surface 1012, 1022 of the second chip 102 and the surface of the substrate 110. In one embodiment, the angle ($\alpha$) ranges from about 60 degree to about 90 degree.

Referring to FIGS. 2 to 4, the isolation groove 103 has a first groove section 1031 and a second groove section 1032 that is continuously connected with the first groove section 1031, and that is arranged in the first direction (Y). The first groove section 1031 has a width in a width direction perpendicular to the first direction (Y) that is greater than a width of the second groove section 1032 in the width direction. In one embodiment, the first groove section 1031 has a width in the width direction that ranges from 10 μm to 50 μm, and the second groove section 1032 has a width in the width direction that ranges from 3 μm to 10 μm. As shown in FIGS. 2 and 4, in the present embodiment, the first groove section 1031 has a wide width, is located at an end of the isolation groove 103, and is proximate to a scribe line (not shown) between two adjacent light-emitting chip units 100. Such a configuration allows a probing needle to picked-up the chips 101, 102 without contacting the bridging structure 104 between the chips 101, 102 during a subsequent die bonding process. This decreases the probability of damaging the bridging structure 104, thereby ensuring reliability of the light-emitting device. Additionally, the first groove section 1031 being formed immediately proximate to the scribe line may minimize loss of light-emitting area of the light-emitting device.

As shown in FIG. 2, in this embodiment, the isolation groove 103 is defined by a bottom and two sidewalls. At the first groove section 1031, one of the sidewalls has a first wall portion 1031-1 that is immediately adjacent to the second groove section 1032 and that extends in a second direction (X) which intersects the first direction (Y), a second wall portion 1031-2 that extends in the first direction (Y), and a curved portion 1033 that connects the first wall portion 1031-1 and the second wall portion 1031-2. It should be understood that the first direction (Y) and the second direction (X) as illustrated in FIG. 2 are only exemplary, and that, in other embodiments, the first direction (Y) and the second direction (X) may intersect but are not necessarily perpendicular to each other. In addition to the curved portion 1033, one of the sidewalls has, at the second groove section 1032, a rounded portion that connects to the first wall portion 1031-1 at the first groove section 1031. Moreover, an end part of the second wall portion 1031-2 away from the curved portion 1033 has an arc shape. This configuration gives the first groove section 1031 a trumpet-like shape, allowing the curved portion 1033 to be widely open for the deposition of vapor material during the formation of the bridging structure 104 when the vapor deposition is directly performed on the sidewalls at the first groove section 1031. The bridging structure 104 formed on such a groove configuration may provide improved uniform coverage and structural integrity for the curved portion 1033, and increase the reliability of the light-emitting device. Additionally, the first groove section 1031 and the second groove section 1032 of the isolation groove 103 helps ensure that the bridging structure 104 may have good coverage on the sidewalls, when the sidewalls are steeply inclined.

Figure 5:
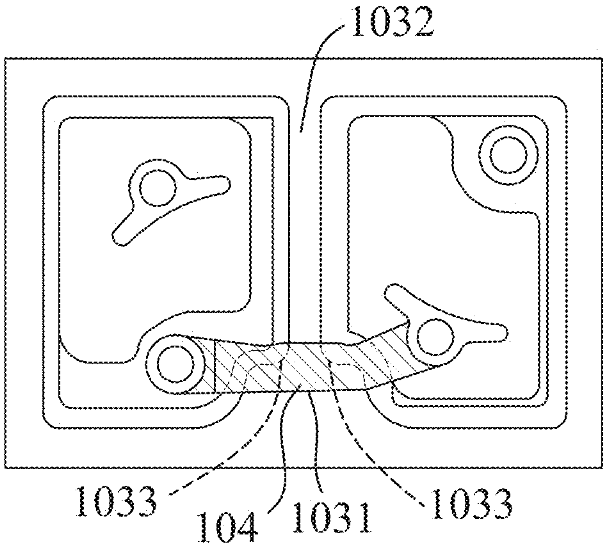
FIG. 5 shows a schematic top view of the light-emitting device of FIG. 2, with a bridging structure illustrated.

FIG. 5 shows the first embodiment of the light-emitting device according to the disclosure, including the bridging structure 104 that is formed between two adjacent ones of the chips 101, 102 (e.g., the first chip 101 and the second chip 102) of the light-emitting chip unit 100, and that electrically connects the two adjacent ones of the chips 101, 102. In certain embodiments, the bridging structure 104 is formed on the bottom and the sidewalls that define the isolation groove 103. The bridging structure 104 may include an electrically conductive metallic material, such as Au, Ag, or the like, with good conductivity. More specifically, the bridging structure 104 is formed on the first mesa surface 1011, 1021 of one of the two adjacent ones of the chips 101, 102 and the second mesa surface 1012, 1022 of the other of the two adjacent ones of the chips 101, 102. The bridging structure 104 is electrically connected to the first semiconductor layer 1201 of one of the two adjacent ones of the chips 101, 102 (e.g., the first chip 101) and the second semiconductor layer 1203 of the other one of the two adjacent ones of the chips 101, 102 (e.g., the second chip 102), thereby enabling the two adjacent ones of the chips 101, 102 to be electrically connected in series. The bridging structure 104 is formed by a lateral vapor deposition process. That is, vapor deposition is directly performed on the first wall portion 1031-1 at the first groove section 1031. As shown in FIG. 5, the bridging structure 104 is formed at a location where the first groove section 1031 and the second groove section 1032 are connected, and covers the curved portion 1033 at the first groove section 1031. In certain embodiments, the bridging structure 104 may cover the rounded portion at the second groove section 1032. In certain embodiments, the bridging structure 104 is formed on the first mesa surface 1011, 1021 of the one of the two adjacent ones of the chips 101, 102 and the second mesa surface 1012, 1022 of the other of the two adjacent ones of the chips 101, 102. The curved portion 1033 provides an increased contact area for the formation of the bridging structure 104, and the bridging structure 104 may have good coverage on the curved portion 1033, so that a strong connection between the bridging structure 104 to the bridged chips 101, 102 can be established without heavy deposition on the sidewalls. This improves stability, adhesion and uniformity of the bridging structure 104 and prevents the formation of defects such as slits or cracks. Referring to FIG. 3B,A portion of the bridging structure 104 that is located on the one of the sidewalls has a thickness (d1), and a portion of the bridging structure 104 that is located on the first mesa surface 1011, 1021 of the one of the two adjacent ones of the chips 101, 102 and the second mesa surface 1012, 1022 of the other one of the two adjacent ones of the chips 101, 102 has a thickness (d2). In this embodiment, the bridging structure 104 has a uniform thickness. A ratio of the first thickness (d1) to the second thickness (d2) ranges from 6:10 to 10:10, which facilitates making the bridging structure 104 thinner while ensuring the reliability of the light-emitting device. For example, in the present embodiment, the bridging structure 104 may include an electrically conductive metallic layer that may have a thickness ranging from 0.1

μm to 2 μm, thereby reducing the manufacturing costs while ensuring production yield of the light-emitting device.

Referring to FIGS. 2, 3A and 4 again, the light-emitting chip unit 100 further includes an electrode structure formed on a first one and a last one of the chips 101, 102. In this embodiment, the electrode structure includes a first electrode 190 formed on the first mesa surface 1021 of the second chip 102 and a second electrode 180 formed on the second mesa surface 1012 of the first chip 101. The first electrode 190 is electrically connected to the first semiconductor layer 1201, and the second electrode 180 is electrically connected to the second semiconductor layer 1203. In one embodiment, the light-emitting device includes a transparent conductive layer 150 formed between the second electrode 180 and the second semiconductor layer 1203. The transparent conductive layer 150 may be an indium tin oxide (ITO) layer and may function as a current spreading layer. In addition, the light-emitting device includes a current blocking layer 170 formed between the transparent conductive layer 150 and the second semiconductor layer 1203 and beneath the second electrode 180. The light-emitting device also includes an insulating protective layer 160 formed on an outermost side of the light-emitting chip unit 100. The insulating protective layer 160 may, for example, include $SiO_2$, $Si_3N_4$, and the like. FIG. 4 illustrates the location of the electrode structure when the light-emitting chip unit 100 includes two chips 101, 102. It should be understood that in the case that the light-emitting chip unit 100 includes more than two chips 101, 102, the first electrode 190 and the second electrode 180 of the electrode structure are respectively located on a first one and a last one of the chips 101, 102.

Second Embodiment

The second embodiment provides a light-emitting device that has a structure similar to the first embodiment except for the isolation groove 103.

Figure 6:
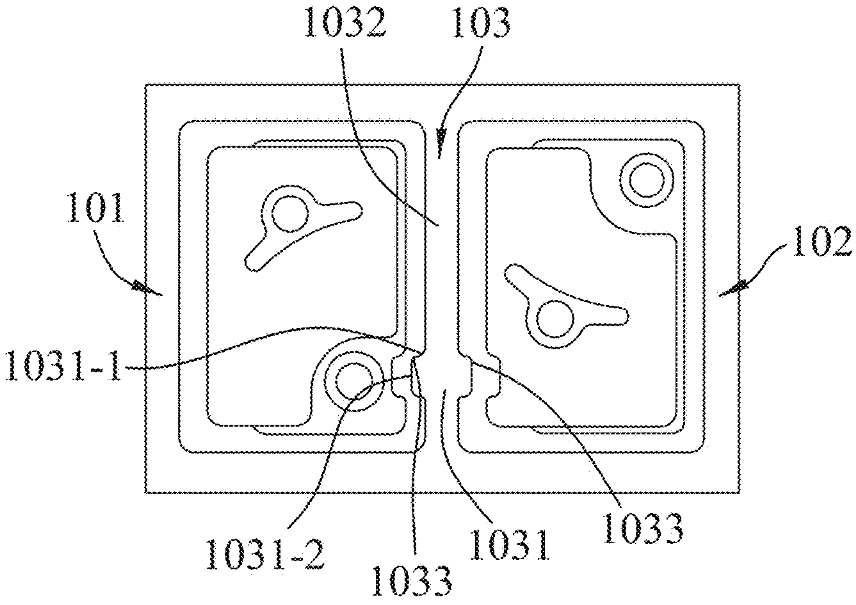
FIG. 6 shows a schematic top view of another embodiment of a light-emitting device according to the present disclosure.

The isolation groove 103, similar to the first embodiment, is defined by the two sidewalls and includes the first groove section 1031. Referring to FIG. 6, in the present embodiment, the first groove section 1031 is, however, located at a position away from both ends of the isolation groove 103, i.e., at a middle area of the isolation groove 103. In some embodiments, the first groove section 1031 is located at a position away from an end of the isolation groove 103. In this embodiment, a position of the first groove section 1031 may be determined based on actual requirements. In addition, similar to the first embodiment, at the first groove section 1031, one of the sidewalls that define the isolation groove 103 has the first wall portion 1031-1 that is immediately adjacent to the second groove section 1032 and extends in the second direction which intersects the first direction, the second wall portion 1031-2 that extends in the first direction, and the curved portion 1033 that connects the first wall portion 1031-1 and the second wall portion 1031-2.

Figure 7:
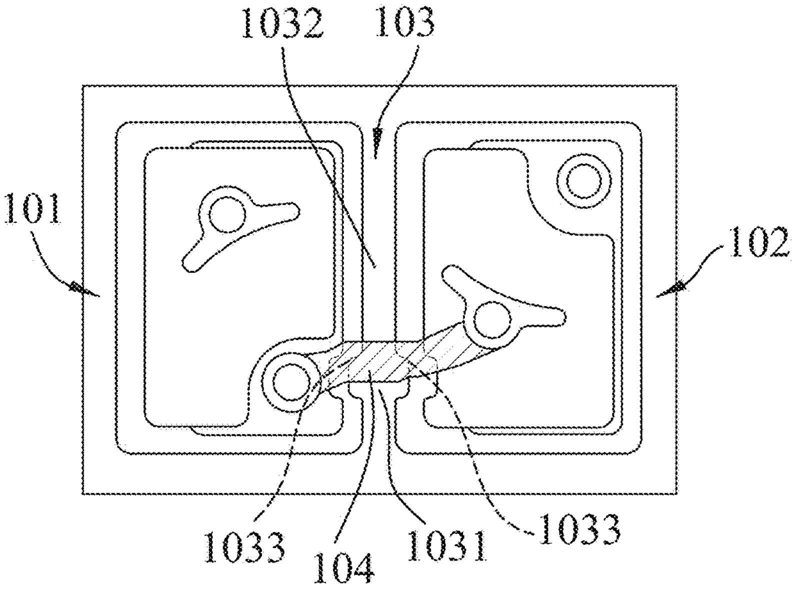
FIG. 7 shows a schematic top view of the light-emitting device of FIG. 6, with the bridging structure illustrated.

Referring to FIG. 7, the light-emitting device similarly includes the bridging structure 104 that is formed between two adjacent ones of the chips 101, 102 (i.e., the first chip 101 and the second chip 102) of the light-emitting chip unit 100. As aforementioned, the bridging structure 104 may include an electrically conductive metallic material, such as Au, Ag, or the like, with good conductivity. The bridging structure 104 is electrically connected to the first semiconductor layer 1201 of one of the two adjacent ones of the chips 101, 102 (e.g., the first chip 101) and the second semiconductor layer 1203 of the other of the two adjacent ones of the chips 101, 102 (e.g., the second chip 102), thereby enabling the two adjacent ones of the chips 101, 102 to be electrically connected in series. The bridging structure 104 is formed by a lateral vapor deposition process. That is, vapor deposition is directly performed on the first wall portion 1031-1 at the first groove section 1031. As shown in FIG. 7, the bridging structure 104 is formed at a location where the first groove section 1031 and the second groove section 1032 are connected, and covers the curved portion 1033 at the first groove section 1031. The curved portion 1033 provides an increased contact area for the bridging structure 104 and the bridging structure 104 may have good coverage over the curved portion 1033, so that a strong connection of the bridging structure 104 to the bridged chips 101, 102 can be established without heavy deposition on the sidewalls. This improves stability, adhesion and uniformity of the bridging structure 104 and prevents the formation of defects such as slits or cracks. In addition, since adhesion between the bridging structure 104 and the curved portion 1033 is enhanced, the bridging structure 104 may be made thinner. For example, in the present embodiment, the bridging structure 104 may have a thickness ranging from 0.1 μm to 2 μm, thereby reducing the manufacturing costs while ensuring the production yield of the light-emitting device.

The isolation groove 103 of the present disclosure is particularly advantageous for a light-emitting device that includes a relatively thick semiconductor laminate 120 (e.g., ranging from 6 μm to 8 μm) and that has a relatively large angle ($\alpha$) (e.g., ranging from 60 degree to 90 degree) between a sidewall and a supporting substrate 110. The configuration of the isolation groove 103 may provide an increased coverage area of the bridging structure 104 on the sidewall and an improved stability of the bridging structure 104.

As mentioned above, the light-emitting device provided by the present disclosure has the following beneficial technical effects:

In the light-emitting device of the present disclosure, the isolation groove 103 between two adjacent ones of the chips 101, 102 has the first groove section 1031 and the second groove section 1032 that are continuously connected. The first groove section 1031 has a width that is greater than a width of the second groove section 1032. The curved portion 1033 is formed at a location where the first groove section 1031 and the second groove section 1032 are connected. The bridging structure 104 formed between the two adjacent ones of the chips of the light-emitting chip unit 100 covers the curved portion 1033, thereby increasing adhesion and stability of the bridging structure 104. Therefore, formation of defects such as slits or cracks are prevented, thereby improving reliability of the light-emitting device. The isolation groove 103 of the present disclosure may provide enhanced stability to the bridging structure 104, particularly for a light-emitting device that includes a relatively thick semiconductor laminate 120 (e.g., a red light-emitting chip unit that has a thickness ranging from 6 μm to 8 μm) and that has a relatively large angle ($\alpha$) (e.g., ranging from 60 degree to 90 degree) between a sidewall and a supporting substrate 110.

In addition, since the curved portion 1033 provides increased adhesion and stability to the bridging structure 104, the bridging structure 104 may be made thinner (e.g., ranging from 0.1 μm to 2 μm). As such, on the one hand, flatness of each plane of the light-emitting device may be ensured for subsequent processing; on the other hand, the manufacturing costs of the light-emitting device may also be effectively reduced.

In this disclosure, the first groove section 1031 with a wide width may be formed immediately proximate to the scribe line between two adjacent light-emitting chip units 100. Such a configuration may facilitate operation of a probing needle without contacting the bridging structure 104 on the chip unit 100 during a chip pick-up step in a subsequent die bonding process. This diminishes possible damages to the bridging structure 104, thereby ensuring reliability of the light-emitting device. On the other hand, the first groove section 1031 being formed immediately proximate to the scribe line may minimize loss of light-emitting area of the light-emitting device.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:

a substrate;

a light-emitting chip unit formed on said substrate and including multiple chips;

an isolation groove extending in a first direction and separating two adjacent ones of said chips, said isolation groove being defined by a bottom and two sidewalls and having a first groove section and a second groove section arranged in said first direction, said first groove section having a width in a width direction perpendicular to said first direction that is greater than a width of said second groove section in said width direction, at said first groove section, one of said sidewalls having a first wall portion that is immediately adjacent to said second groove section and that extends in a second direction which intersects said first direction, a second wall portion that extends in said first direction, and a curved portion that connects said first wall portion and said second wall portion; and a bridging structure that is formed on said bottom and said sidewalls, that covers said curved portion, and that electrically connects said two adjacent ones of said chips;

wherein each of said chips includes a semiconductor laminate formed on said substrate, said semiconductor laminate including a first semiconductor layer, an active layer, and a second semiconductor layer that are disposed on said substrate in a thickness direction in such order, said active layer having a thickness ranging from 6 μm to 8 μm in the thickness direction;

wherein said semiconductor laminate of each of said chips having a first mesa surface that is constituted by said first semiconductor layer, and a second mesa surface that is constituted by said second semiconductor layer;

wherein said first mesa surface of one of said two adjacent ones of said chips is adjacent to said second mesa surface of the other of said two adjacent ones of said chips;

wherein said bridging structure is formed on said first mesa surface of said one of said two adjacent ones of said chips and said second mesa surface of said the other of said two adjacent ones of said chips;

wherein a portion of said bridging structure that is located on said one of said sidewalls has a thickness (d1), and a portion of said bridging structure that is located on one of said first mesa surface of said one of said two adjacent ones of said chips and said second mesa surface of said the other of said two adjacent ones of said chips has a thickness (d2), where d1: d2 ranges from 6:10 to 10:10.

2. The light-emitting device as claimed in claim 1, wherein an angle (a) between said one of said sidewalls and a surface of said substrate ranges from 60° to 90°.

3. The light-emitting device as claimed in claim 1, wherein said semiconductor laminate of each of said chips has a connecting surface that interconnects said second mesa surface and said first mesa surface, and that is inclined with respect to an imaginary surface that extends from said first mesa surface by an angle ranging from 50 degree to 70 degree.

4. The light-emitting device as claimed in claim 1, wherein said first groove section of said isolation groove is located at an end of said isolation groove.

5. The light-emitting device as claimed in claim 4, wherein an end part of said second wall portion away from said curved portion has an arc shape.

6. The light-emitting device as claimed in claim 1, wherein said width of said first groove section ranges from 10 μm to 50 μm.

7. The light-emitting device as claimed in claim 1, wherein said width of said second groove section ranges from 3 μm to 10 μm.

8. The light-emitting device as claimed in claim 1, wherein said bridging structure includes an electrically conductive metallic layer that has a thickness ranging from 0.1 μm to 2 μm.

9. The light-emitting device as claimed in claim 1, further comprising an insulating dielectric layer disposed within said isolation groove, said bridging structure formed on said insulating dielectric layer.

10. The light-emitting device as claimed in claim 1, wherein said light-emitting device is a red light-emitting device.

11. The light-emitting device as claimed in claim 1, wherein said chips are electrically connected in series, and said light-emitting chip unit further includes an electrode structure formed on a first one and a last one of said chips.

12. The light-emitting device as claimed in claim 11, wherein said electrode structure includes a first electrode and a second electrode that are respectively formed on said last one and said first one of said chips.

13. The light-emitting device as claimed in claim 1, further comprising an insulating protective layer that is formed on said light-emitting chip unit.

14. The light-emitting device as claimed in claim 13, wherein said insulating protective layer includes $SiO_2$ and $Si_3N_4$.

15. The light-emitting device as claimed in claim 1, wherein said first groove section of said isolation groove is located at a position that is away from an end of said isolation groove.

16. The light-emitting device as claimed in claim 1, wherein at said second groove section, said one of said sidewalls has a rounded portion that connects to said first wall portion at said first groove section, said bridging structure covering said rounded portion.

17. The light-emitting device as claimed in claim 1, wherein said first groove section and said second groove section of said isolation groove are continuously connected.

18. A light-emitting device, comprising:

a substrate;

a light-emitting chip unit formed on said substrate and including multiple chips;

an isolation groove extending in a first direction and separating two adjacent ones of said chips, said isolation groove being defined by a bottom and two sidewalls and having a first groove section and a second groove section arranged in said first direction, said first groove section having a width in a width direction perpendicular to said first direction that is greater than a width of said second groove section in said width direction, at said first groove section, one of said sidewalls having a first wall portion that is immediately adjacent to said second groove section and that extends in a second direction which intersects said first direction, a second wall portion that extends in said first direction, and a curved portion that connects said first wall portion and said second wall portion; and a bridging structure that is formed on said bottom and said sidewalls, that covers said curved portion, and that electrically connects said two adjacent ones of said chips;

wherein at said second groove section, said one of said sidewalls has a rounded portion that connects to said first wall portion at said first groove section, said bridging structure covering said rounded portion.

* * * * *